United States Patent
Hwang et al.

(10) Patent No.: US 7,376,481 B2
(45) Date of Patent: May 20, 2008

(54) METHODS AND CONTROL SYSTEMS FOR CONTROLLING SEMICONDUCTOR DEVICE MANUFACTURING PROCESSES

(75) Inventors: Jin-ho Hwang, Gyeonggi-do (KR); Joo-cheol Han, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 86 days.

(21) Appl. No.: 11/430,571

(22) Filed: May 9, 2006

(65) Prior Publication Data

US 2007/0118244 A1 May 24, 2007

(30) Foreign Application Priority Data

Nov. 22, 2005 (KR) .................... 10-2005-0111998

(51) Int. Cl.
*G06F 19/00* (2006.01)
(52) U.S. Cl. ..................................... 700/121; 700/96
(58) Field of Classification Search .............. 700/96, 700/121, 182; 257/48, 620; 438/11, 14, 438/15, 18
See application file for complete search history.

(56) References Cited

U.S. PATENT DOCUMENTS

| | | | |
|---|---|---|---|
| 6,484,300 B1 | 11/2002 | Kim et al. | |
| 6,844,262 B1 | 1/2005 | Nguyen et al. | |
| 6,875,997 B2 | 4/2005 | Park et al. | |
| 2003/0119322 A1* | 6/2003 | Hirai et al. | 438/692 |
| 2004/0203321 A1* | 10/2004 | Tsuchiyama et al. | 451/6 |

* cited by examiner

*Primary Examiner*—Kidest Bahta
(74) *Attorney, Agent, or Firm*—Myers Bigel Sibley & Sajovec, P.A.

(57) ABSTRACT

A method of controlling a semiconductor device manufacturing process for a product which is newly applied and a control system for the same process are provided. According to an embodiment on the control method, a sample process time for a product applied to the semiconductor device manufacturing process for the first time is calculated. The semiconductor device manufacturing process is performed based on the calculated sample process time. Then, a main process time is calculated by applying the stored sample process time to a main process time equation. The semiconductor device manufacturing process can be controlled on the basis of the main process time. The sample process time may be stored in an information storage table.

24 Claims, 3 Drawing Sheets

METHODS AND CONTROL SYSTEMS FOR CONTROLLING SEMICONDUCTOR DEVICE MANUFACTURING PROCESSES

CROSS-REFERENCE TO RELATED PATENT APPLICATION

This application claims the benefit of Korean Patent Application No. 10-2005-0111998, filed on Nov. 22, 2005, in the Korean Intellectual Property Office, the disclosure of which is incorporated herein in its entirety by reference.

BACKGROUND OF THE INVENTION

The present invention relates to semiconductor devices and fabrication methods thereof, and more particularly, to methods of controlling semiconductor device manufacturing processes and control systems for such processes.

Semiconductor devices are manufactured through various processes. For instance, semiconductor devices are manufactured by performing sequential processes including crystal growth of a semiconductive material, manufacturing a wafer from the semiconductive crystal, etching, doping, ion-implantation, packaging, and final testing. However, these sequential processes may be performed at different apparatuses using different control methods. A control system to precisely control a process condition is often necessary or desirable to maintain appropriate statuses of the individual processes. In most of the manufacturing processes, process conditions can be controlled appropriately by controlling an execution time of the process (hereinafter referred to as the "process time"). For example, a time controlled process can be a rapid thermal process, a chemical mechanical polishing (CMP) process, an overlay process, a physical deposition process, a chemical deposition process, or a spin coating process.

In the case of a CMP process, the thickness of a material removed by the CMP process varies depending on a process time. A conventional CMP process is carried out by being divided into a sample CMP process and a main CMP process. The sample CMP process determines a removal rate (Å/sec) from a blanket wafer where patterns are not formed. A process time for an actual wafer to be polished to remove material according to the determined removal rate (i.e., a polishing time) is calculated empirically and, afterwards, the sample CMP process is performed.

If a thickness deviation by the sample CMP process is within an allowable range, the main CMP process is performed. The process time can be controlled via a manual feedback by continuously checking thicknesses of lots to which the main CMP process is applied. For instance, if a removal thickness of the lot after the main CMP process is larger than an intended thickness, the process time is shortened, and if less than intended, the process time is lengthened. Herein, the process time is empirical, and the CMP process can be applied to one product without difficulty.

In the case of multiple types of products (e.g., in a system LSI manufacturing line) the densities of patterns for each product are different from each other, and, thus, the process times are different from each other. Therefore, process times are empirically collected and made into a separate table for each product (hereinafter referred to as "process table") and, when a specific product is subjected to a corresponding process, the process time stored in the process table is used.

However, the execution of the processes for the multiple types of products based on the empirical data may have a potential risk of an error, or may be highly sensitive to a manufacturer's mistake, which might bring out a poor process distribution. Also, in the case of a CMP process, consumable articles such as a polishing pad may not function properly as time elapses. As a result, a removal rate may be reduced, and this reduced removal rate may cause a poor or inconsistent process distribution. An advanced process control (APC) method that calculates a process time via an automatic input of the conventional empirical process condition has been implemented systematically to reduce a degree of process distribution. According to the APC method, a process time can be calculated automatically using a conversion factor (CF) for process times of products.

However, in contrast to those conventional or previously processed products, which can be manufactured with less limitation with the implementation of the APC method, manufacture of newly developed products may be limited because there is no established process table due to novelty of the products and a difficulty in the implementation of the APC method due to restricted use of the conversion factor.

SUMMARY OF THE INVENTION

Embodiments of the present invention provide a method of controlling a semiconductor device manufacturing process for a product applied to the semiconductor device manufacturing process for the first time by automatically calculating process conditions for the product, and a control system for such a process.

According to an aspect of the present invention, there is provided a method of controlling a semiconductor device manufacturing process including: calculating a sample process time for a product applied to the semiconductor device manufacturing process for the first time; performing the semiconductor device manufacturing process for a sample based on the calculated sample process time; calculating a main process time by applying the stored sample process time to a main process time equation; and controlling the semiconductor device manufacturing process based on the main process time. The sample process time may be stored in an information storage table from which it is retrieved for calculating the main process time.

The sample process time for the product may be calculated by sequential operation including: determining a predetermined ratio of a conversion factor for process times of conventional or previously processed semiconductor products corresponding to a consumption time of a consumable article used in the semiconductor device manufacturing process; and multiplying the calculated ratio of a conversion factor with a conversion factor for the applied product.

The calculating of the main process time may be performed using the main process time calculation equation defined as follows:

$$T_n = \{T_{n-1} + E_n\} \times CF_n / CF_{n-1} \qquad \text{EQ. 1}$$

where '$T_n$', '$T_{n-}$', '$E_n$', '$CF_n$', and '$CF_{n-1}$' represent a process time of a current operation stage, a process time of a previous operation stage, an error factor with respect to a thickness of the product, a conversion factor of the current operation stage of the semiconductor device manufacturing process, and a conversion factor of the previous operation stage thereof, respectively. If the main process is being performed for the first time (n=1), the sample process time may be substituted for '$T_{n-1}$', the conversion factor $CF_n$ may be substituted for '$CF_{n-1}$', and '$T_n$' may be taken as an initial main process time for the product. After the initial performance of the main process, normal values are substituted.

The conversion factor '$CF_n$' may be calculated by multiplying a first conversion factor corresponding to an increasing or decreasing thickness of the product during the semiconductor device manufacturing process with a second conversion factor corresponding to a pattern density of the product.

According to another aspect of the present invention, there is provided a control system for a semiconductor device manufacturing process including: a sample logic unit to calculate a sample process time of a product applied to the semiconductor device manufacturing process for the first time; and a main process control unit to calculate a main process time by applying the sample process time to a main process time calculation equation and to control the semiconductor device manufacturing process. The system may further include an information storage table unit to receive the sample process time from the sample logic unit and to store the received sample process time, and from which the sample process time is retrieved for calculating the main process time.

The main process control unit may include a main process time calculation unit and an external apparatus control unit, which controls an external apparatus. The control system can be implemented for various manufacturing processes for a product which is newly applied such as a chemical mechanical polishing (CMP) process, a deposition process, an etching process, and a cleaning process.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EMBODIMENTS OF THE INVENTION

The present invention now will be described more fully hereinafter with reference to the accompanying drawings, in which illustrative embodiments of the invention are shown. In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art.

As used herein the expression "and/or" includes any and all combinations of one or more of the associated listed items. The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Figure 1:
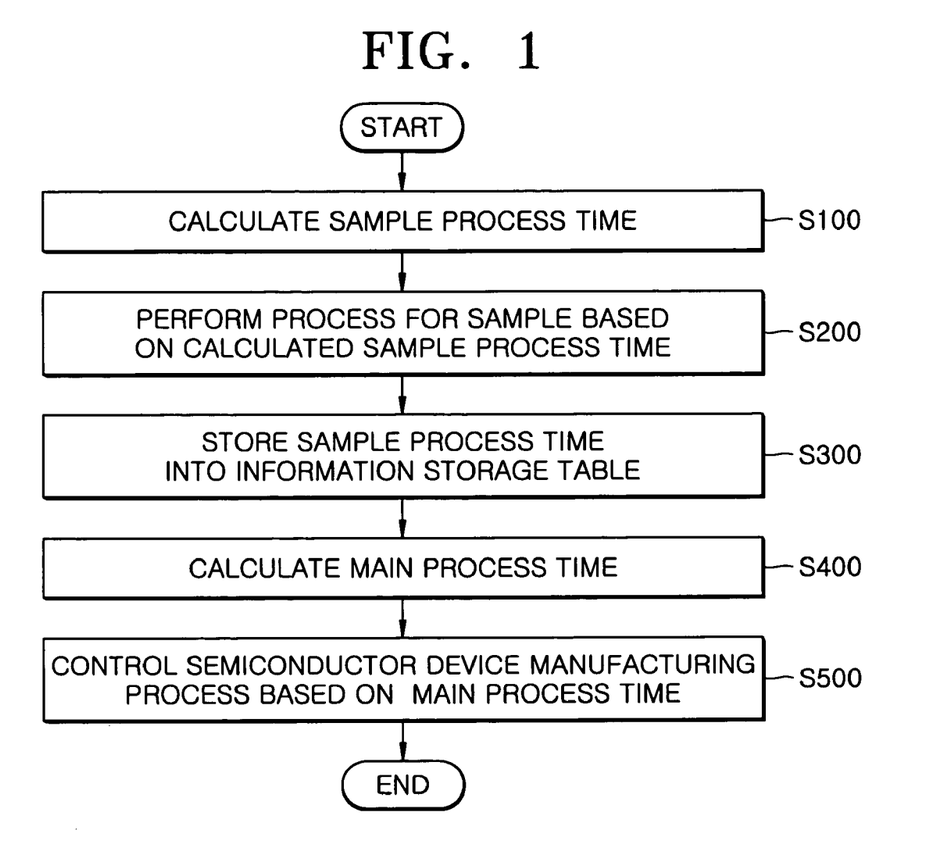
FIG. 1 is a flowchart representing a method of controlling a semiconductor device manufacturing process according to embodiments of the present invention.

FIG. 1 is a flowchart illustrating a method of controlling a semiconductor device manufacturing process according to embodiments of the present invention.

In operation S100, a process time of a sample for a product which is newly applied into a semiconductor device manufacturing process is calculated. In the case of conventional products which are formulated into empirical data, the calculation of the sample process time is also executed to calculate a process time depending on a certain factor such as a pattern density. Particularly, the process time is calculated based on previously established empirical data. However, those empirical data may not be usable for a product that is implemented in the semiconductor manufacturing process for the first time. Hence, in accordance with embodiments of the present invention, the process time is calculated by considering factors that can be commonly applied to all types of products. A more detailed description of the calculation will be provided with reference to FIG. 2.

In operation S200, a process for the sample (hereinafter referred to as "sample process") is performed based on the calculated process time to confirm an allowable range of an error for the calculated process time of the sample (hereinafter referred to as "sample process time"), generally. Also, in the case of the conventional products, a calculation formula for the sample process time can be corrected by this operation.

In operation S300, the sample process time is stored in a table in which information on a process time is stored (hereinafter referred to as "information storage table"). In operation S400, a main process time is calculated by applying the sample process time stored in the information storage table to a calculation formula for the main process time. In operation S500, a corresponding manufacturing process is performed and controlled based on the main process time (e.g., the duration of the main process is controlled based on the main process time). The main process time is updated continuously as processes are performed. The calculation of the main process time in accordance with embodiments of the invention will be described in more detail with reference to the drawings and calculation formulae hereinafter. Also, the description is based on a CMP process, which is an exemplary process.

Figure 2:
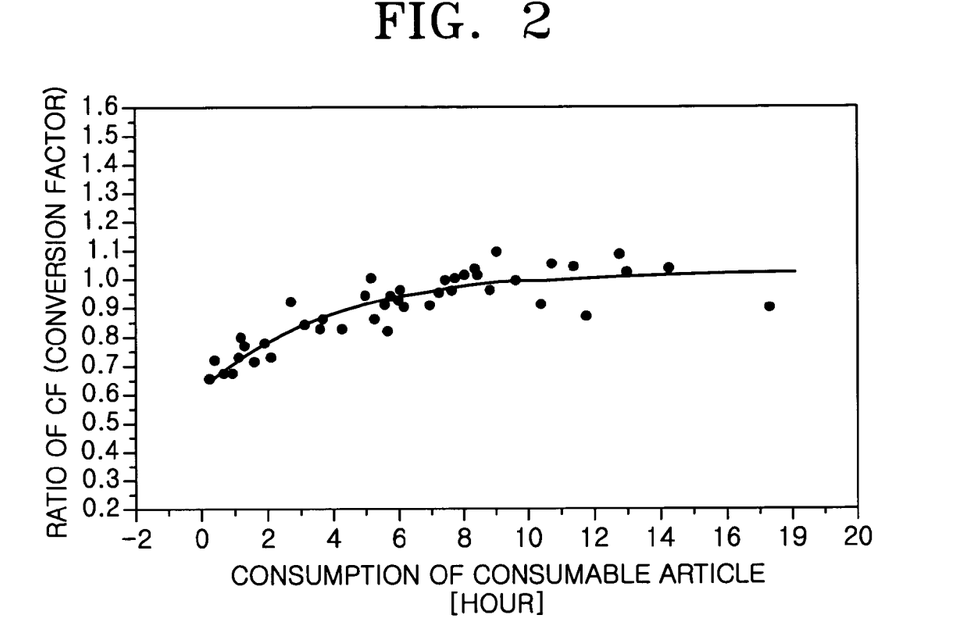
FIG. 2 is a graph illustrating a ratio of a conversion factor with respect to a consumption time of a consumable article.

A graph as illustrated in FIG. 2 may be used to calculate or determine a sample process time. A horizontal axis (e.g., X-axis) denotes a consumption time of a consumable article used in the semiconductor device manufacturing process, while a vertical axis (e.g., Y-axis) denotes a ratio of a conversion factor common to all types of products. Generally, for the conventional or previously processed or implemented products, conversion factors for process times are calculated based on previously established empirical data. However, because no conversion factor is calculated for a newly implemented product, a conversion factor which is most commonly applicable needs to be calculated, and a ratio of a conversion factor depending on or corresponding to a consumption time of a consumable article used in a process needs to be calculated.

A ratio of a conversion factor (which may be referred to as a "predetermined ratio of a conversion factor") for all types of products is marked in an X-Y coordinate system for each consumption time of a consumable article, and the marked ratios of the conversion factors are formulated into a graph or equation. The graph can be used to calculate a predetermined or known ratio of a conversion factor corresponding to a consumption time of a consumable article used in a process of manufacturing a newly implemented product.

Particularly, FIG. 2 is an exemplary graph illustrating a ratio of a conversion factor with respect to a consumption time of a disk used to remove an oxide layer during a copper-contact line process. As the consumption time of the disk is shorter (i.e., the disk has been used for shorter duration of polishing), the disk will provide a higher rate of removal of the oxide layer, the process time will therefore be shorter, and thus, the ratio of the conversion factor is smaller. In contrast, if the consumption time is longer, performance of the disk is reduced, thereby resulting in a lengthened process time and a larger ratio of the conversion factor. Since a graph for a ratio of a conversion factor depending on a consumption time of a consumable article can be applied substantially identically to all semiconductor products, this graph can be used for a product which is applied for the first time.

The sample process time is calculated by multiplying the above calculated ratio of the conversion factor (e.g., using the graph of FIG. 2) with a conversion factor for the newly implemented product. The conversion factor for the newly implemented product is obtained by multiplying a conversion factor 1 ($CF_1$) depending on or corresponding to an increasing or decreasing thickness of a product during a process with a conversion factor 2 ($CF_2$) depending on or corresponding to a pattern density of the product.

Figure 3:
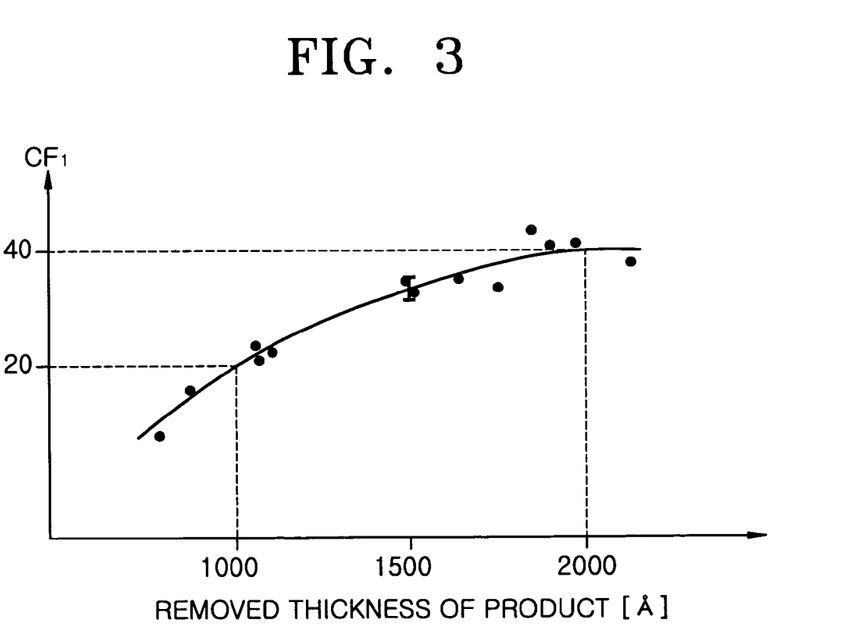
FIG. 3 is a graph illustrating a conversion factor 1 ($CF_1$) with respect to the thickness of a product removed by a process.

FIG. 3 is an exemplary graph for calculating the conversion factor 1 ($CF_1$) corresponding to an increasing or decreasing thickness of a product during a process. Particularly, this graph depicts a relationship between a thickness of a product removed during a CMP process and the conversion factor $CF_1$ corresponding to the product removed thickness.

A horizontal axis (e.g., X-axis) denotes the thickness of the product removed by the CMP process and expressed in angstroms. A vertical axis (e.g., Y-axis) denotes the conversion factor $CF_1$ and is not expressed in a specific unit. This exemplary graph is obtained by marking each removed thickness of the product and the conversion factor $CF_1$ corresponding to the removed thickness of the product in an X-Y coordinate system. A general equation for this illustrated relationship can be obtained. An intended removed thickness of the newly implemented product is selected. Thus, using the graph, the appropriate conversion factor $CF_1$ is calculated or determined as the conversion factor $CF_1$ corresponding to the intended removed thickness of the newly implemented product. Although the conversion factor $CF_1$ is expressed in a certain real number in the graph, the conversion factor $CF_1$ can be expressed after being normalized. The conversion factor $CF_1$ is a conversion factor without taking account of a pattern density of a product. Also, there may include a deviation as indicated in a bold 'I' mark in the graph.

Figure 4:
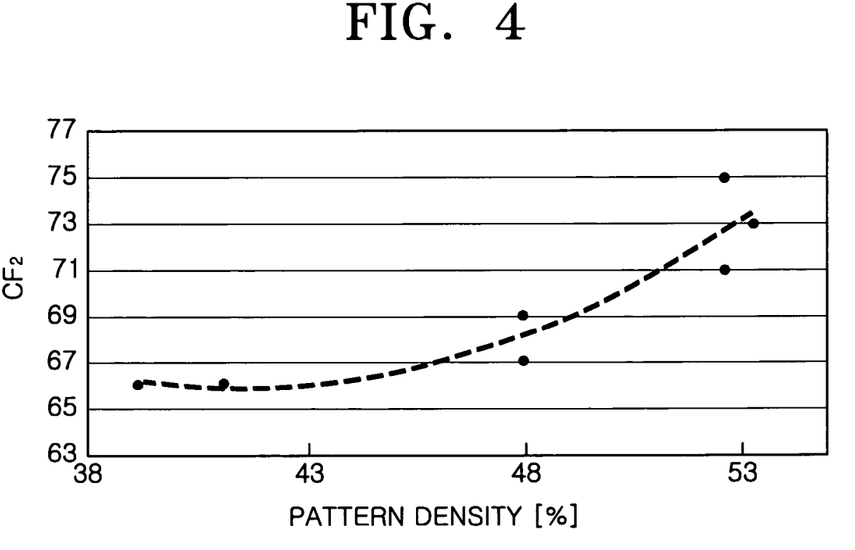
FIG. 4 is a graph illustrating a conversion factor 2 ($CF_2$) with respect to a pattern density of a product.

FIG. 4 illustrates an exemplary graph used to calculate a conversion factor 2 ($CF_2$) depending on a pattern density of a product.

A horizontal axis (e.g., X-axis) denotes a pattern density of a product, particularly, the density of a pattern in a local region where the pattern is formed, and is expressed as a percentage. The pattern density expressed in percentage is a ratio of an area of a region where the pattern is formed in the local region to an area of the local region. A vertical axis (e.g., Y-axis) denotes the conversion factor $CF_2$ and is not expressed in a certain unit. Alternatively, the conversion factor $CF_2$ can be expressed in normalized numbers. In this graph, the conversion factor $CF_2$ is expressed as a quadratic equation with respect to the pattern density (i.e., $y=ax^2+bx+c$). The conversion factor $CF_2$ can also be expressed using other equations.

The pattern density of the newly implemented product is obtained by measuring a certain portion using a suitable measuring device. Within a measured portion area having a radius of approximately 100 μm, the measurement result most closely coincides with the illustrated graph for the conversion factor $CF_2$. Therefore, for a newly implemented product, a pattern density within an area having a radius of approximately 100 μm of the measured portion is determined using a measuring device for the pattern density, and the conversion factor $CF_2$ is calculated by determining the conversion factor $CF_2$ corresponding to the measured pattern density in the graph illustrated in FIG. 4.

Thus, in summary, in accordance with some embodiments of the invention, the sample process time for the newly implemented product is calculated as follows. The consumption time of the consumable article is determined and the corresponding predetermined or known ratio of a conversion factor is determined from the graph of FIG. 2. An intended thickness to be removed from the newly implemented product is selected and the corresponding conversion factor $CF_1$ is determined from the graph of FIG. 3. A pattern density of a selected portion of the newly implemented product is measured and the corresponding conversion factor $CF_2$ is determined from the graph of FIG. 4. The conversion factor $CF_1$ and the conversion factor $CF_2$ are multiplied by one another to provide a conversion factor for the newly implemented product. This conversion factor is multiplied by the determined known ratio of the conversion factor to provide the sample process time. The sample process time is then used to execute the process as discussed above with regard to operation S200.

Hereinafter, the calculation of the main process time will be described in more detail. Although many calculation equations can be used to calculate the main process time, an equation for calculating a polishing time of the CMP process is used as an example in the present embodiment. The calculation equation for the polishing time can be defined as follows.

$$T_n = \{T_{n-1} + E_n\} \times CF_n / CF_{n-1} \qquad \text{EQ. 1}$$

Herein, '$T_n$' and '$T_{n-1}$' represent a CMP process time of a current operation stage and a CMP process time of a previous operation stage, respectively. Also, '$E_n$', '$CF_n$' and '$CF_{n-1}$' represent an error factor with respect to a thickness of a product, a conversion factor of the CMP process time of the current operation stage, and a conversion factor of the CMP process time of the previous operation stage, respectively. The calculation equation for the polishing time can be applied substantially the same to the calculation of a polishing time for the conventional product. In the case of the newly implemented product, numerical values inputted during operation of an initial process can vary. In other words, if n=1, the calculated sample process time is substituted for (i.e., used as the value for) '$T_{n-1}$', while a conversion factor of '$CF_n$' is substituted for '$CF_{n-1}$'. After the initial process, normal numerical values are substituted for '$T_{n-1}$' and '$CF_{n-1}$'.

The error factor '$E_n$' can be expressed as follows.

$$E_n = \{(PoT_{n-1} - PoTT_{n-1}) + (PrT_n - PrTT_n) - (PrT_{n-1} - PrTT_{n-1})\}/RR \quad \text{EQ. 2}$$

Herein, '$PoT_{n-1}$' and '$PoTT_{n-1}$' represent a remaining thickness of a product after a previous CMP process and a target thickness thereof after the previous CMP process, respectively. '$PrT_n$' and '$PrTT_n$' represent a thickness of the product to be subjected to a current CMP process and a target thickness thereof, respectively. '$PrT_{n-1}$' and '$PrTT_{n-1}$' represent a thickness of the product and a target thickness thereof before the current CMP process, respectively, but the product is a product after the current CMP and may be the same or different product as the product to be subjected to a current CMP process. If the products are the same, the second parenthesis and the third parenthesis cancel each other. 'RR' represents an average removal rate of the product by the CMP process. When the main process is performed for the first time (i.e., n=1), a numerical value of 0 is substituted for '$PoT_{n-1}$' and '$PoTT_{n-1}$'.

The main process time is calculated with consideration of various factors as above, and as the manufacturing process proceeds, a more accurate process time is calculated. Once the process time is calculated, the CMP process is applied to a next product, and based on the result from this CMP process applied to the next product, the process time is calculated again. According to embodiments of the present invention, the main process time calculation equation can be applied to a newly implemented product that does not have any empirical data, and thus, an automatic process can be achieved even in newly implemented products. As mentioned above, the conventional semiconductor manufacturing process is performed based on the previously established empirical data including various test and determination results and manipulation by the manufacturer, and the reliance of the conventional semiconductor manufacturing process on these mentioned factors can give rise to a loss of process time and a poor process distribution. However, embodiments of the present invention can provide a solution to overcome these disadvantages.

Figure 5:
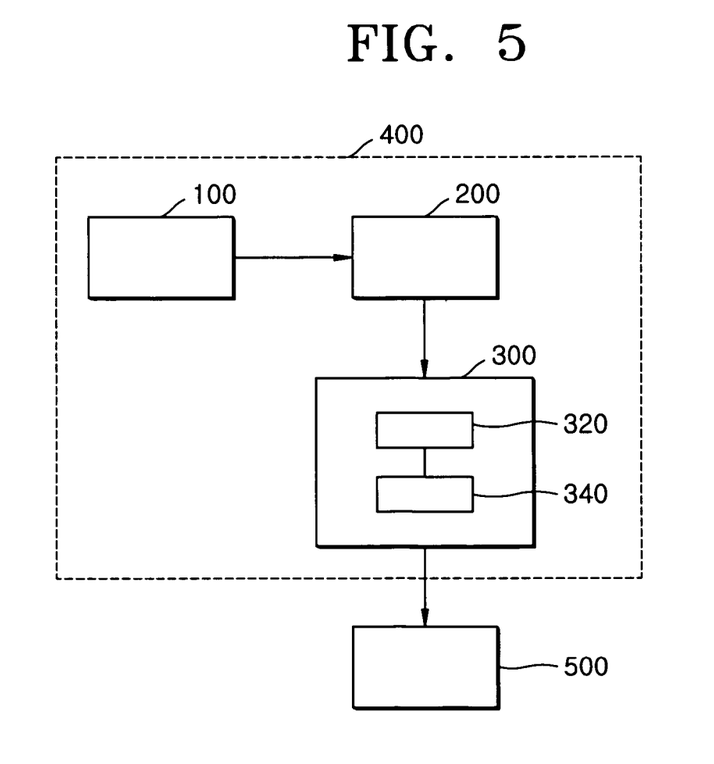
FIG. 5 is a block diagram schematically illustrating a control system for a semiconductor manufacturing process according to embodiments of the present invention.

FIG. 5 is a block diagram illustrating a control system for a semiconductor manufacturing process according to embodiments of the present invention.

The control system for the semiconductor manufacturing process 400 (hereinafter referred to as the "control system") includes a sample logic unit 100, an information storage table unit 200 and a main process control unit 300. The sample logic unit 100 calculates a sample process time of a product applied newly to the manufacturing process. The information storage table unit 200 receives the sample process time from the sample logic unit 100 and stores the received sample process time. The main process control unit 300 calculates a main process time by applying the sample process time stored into the information storage table unit 200 to the main process time calculation equation and controls the semiconductor device manufacturing process. The main process control unit 300 includes a main process calculation unit 320 and an external apparatus control unit 340. The main process calculation unit 320 calculates the main process time, and the external apparatus control unit 340 controls an external apparatus 500 based on the calculated main process time.

According to some embodiments, the control system 400 can control a CMP process, a deposition process, an etching process, and/or a cleaning process. Particularly, in the case of a CMP process, the external apparatus 500 is an apparatus for performing the CMP process. The above-described process time calculation method can be applied to process time calculation logic for the control system 400.

According to the exemplary embodiments of the present invention, a conversion factor for a product newly applied to a semiconductor device manufacturing process and a ratio thereof are calculated, and the calculated conversion factor and the ratio thereof are applied to a main process time calculation equation to calculate a main process time. As a result, an automatic process can be achieved for the new product. Also, the automatic process can reduce a process time and can reduce a degree of process distribution.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the invention.

What is claimed is:

1. A method of controlling a semiconductor device manufacturing process comprising:
   calculating a sample process time for a product applied to the semiconductor device manufacturing process for the first time;
   performing the semiconductor device manufacturing process for a sample based on the calculated sample process time;
   calculating a main process time by applying the sample process time to a main process time equation; and
   controlling the semiconductor device manufacturing process based on the main process time;
   wherein calculating the sample process time comprises:
   determining a predetermined ratio of a conversion factor for process times of semiconductor products corresponding to a consumption time of a consumable article used in the semiconductor device manufacturing process; and
   calculating the sample process time by multiplying the predetermined ratio of a conversion factor with a conversion factor for the applied product.

2. The method of claim 1, including storing the sample process time in an information storage table and retrieving the stored sample process time for calculating the main process time.

3. The method of claim 1, wherein performing the semiconductor manufacturing process comprises performing at least one of a chemical mechanical polishing (CMP) process, a deposition process, an etching process, and a cleaning process.

4. A method of controlling a semiconductor device manufacturing process comprising:
   calculating a sample process time for a product applied to the semiconductor device manufacturing process for the first time;
   performing the semiconductor device manufacturing process for a sample based on the calculated sample process time;
   calculating a main process time by applying the sample process time to a main process time equation; and controlling the semiconductor device manufacturing process based on the main process time;
wherein calculating the main process time comprises using the main process time calculation equation defined as follows:

$$T_n = \{T_{n-1} + E_n\} \times CF_n / CF_{n-1}$$

where '$T_n$', '$T_{n-1}$', '$E_n$', '$CF_n$', and '$CF_{n-1}$' represent a process time of a current operation stage, a process time of a previous operation stage, an error factor with respect to a thickness of the product, a conversion factor of the current operation stage of the semiconductor device manufacturing process, and a conversion factor of the previous operation stage thereof, respectively.

5. The method of claim 4, wherein calculating of the main process time comprises:
if the main process is performed for the first time (n=1), substituting the sample process time for '$T_{n-1}$', substituting the conversion factor '$CF_n$' for '$CF_{n-1}$', and taking '$T_n$' as an initial main process time for the product.

6. The method of claim 4, wherein calculating the main process time comprises calculating the conversion factor '$CF_n$' by multiplying a first conversion factor corresponding to an increasing or decreasing thickness of the product during the semiconductor device manufacturing process with a second conversion factor corresponding to a pattern density of the product.

7. The method of claim 6, wherein calculating the main process time comprises:
determining the first conversion factor using a graph or an equation for known conversion factors corresponding to the increasing or decreasing thickness of the product; and
determining the second conversion factor using a graph or an equation for known conversion factors corresponding to the pattern density of the product.

8. The method of claim 4, wherein calculating the main process time comprises using the error factor defined as follows:

$$E_n = \{(PoT_{n-1} - PoTT_{n-1}) + (PrT_n - PrTT_n) - (PrT_{n-1} - PrTT_{n-1})\}/RR$$

where: '$PoT_{n-1}$' and '$PoTT_{n-1}$' represent a remaining thickness of the product after a previous process and a target thickness thereof after the previous process, respectively; '$PrT_n$' and '$PrTT_n$' represent a thickness of the product to be subjected to a current process and a target thickness thereof, respectively; '$PrT_{n-1}$' and '$PrTT_{n-1}$' represent a thickness of the product and a target thickness thereof before the current CMP process, respectively, wherein the product is a product after the current CMP process; and 'RR' represents an average removal rate of the product by the process.

9. The method of claim 8, where calculating the main process time comprises:
if the main process is performed for the first time (n=1), substituting a numerical value of 0 for each of '$PoT_{n-1}$' and '$PoTT_{n-1}$'.

10. A method of controlling a semiconductor device manufacturing process comprising:
calculating a sample process time for a product applied to the semiconductor device manufacturing process for the first time;
performing the semiconductor device manufacturing process for a sample based on the calculated sample process time;
calculating a main process time by applying the sample process time to a main process time equation; and
controlling the semiconductor device manufacturing process based on the main process time;
wherein performing the semiconductor manufacturing process comprises performing at least one of a chemical mechanical polishing (CMP) process, a deposition process, an etching process, and a cleaning process; and
wherein the main process is a CMP process, the main process time is a CMP process time, and calculating the sample process time comprises:
determining a predetermined ratio of a conversion factor for CMP process times of semiconductor products corresponding to a consumption time of a consumable article used in the CMP process; and
calculating the sample process time for the CMP process by multiplying the predetermined ratio of a conversion factor with a conversion factor for the applied product.

11. The method of claim 10, wherein consumable article is a polishing pad or a disk for the CMP process.

12. The method of claim 10, wherein the calculating of the CMP process time comprises using the CMP process time calculation equation defined as follows:

$$T_n = \{T_{n-1} + E_n\} \times CF_n / CF_{n-1}$$

where '$T_n$', '$T_{n-1}$', '$E_n$', and '$CF_{n-1}$' represent a CMP process time of a current operation stage, a CMP process time of a previous operation stage, an error factor with respect to a thickness of the product, a conversion factor of the current operation stage of the CMP process, and a conversion factor of the previous operation stage thereof, respectively.

13. The method of claim 12, wherein calculating the CMP process time comprises:
if the CMP process is performed for the first time (n=1), substituting the sample process time for the CMP process for '$T_{n-1}$', substituting the conversion factor for the CMP process '$CF_n$' for '$CF_{n-1}$', and taking '$T_n$' as an initial CMP process time for the product.

14. The method of claim 12, wherein calculating the CMP process time comprises calculating the conversion factor '$CF_n$' by multiplying a first conversion factor corresponding to a decreasing thickness of the product during the CMP process with a second conversion factor corresponding to a pattern density of the product.

15. The method of claim 14, wherein calculating the CMP process time comprises:
determining the first conversion factor using a graph or an equation for known conversion factors corresponding to the decreasing thickness of the product by the CMP process; and
determining the second conversion factor using a graph or an equation for known conversion factors corresponding to the pattern density of the product.

16. A method of controlling a semiconductor device manufacturing process comprising:
calculating a sample process time for a product applied to the semiconductor device manufacturing process for the first time;
performing the semiconductor device manufacturing process for a sample based on the calculated sample process time;
calculating a main process time by applying the sample process time to a main process time equation; and controlling the semiconductor device manufacturing process based on the main process time;

wherein performing the semiconductor manufacturing process comprises performing at least one of a chemical mechanical polishing (CMP) process, a deposition process, an etching process, and a cleaning process; and wherein calculating the CMP process time comprises using the error factor defined as follows:

$$E_n = \{(PoT_{n-1} - PoTT_{n-1}) + (PrT_n - PrTT_n) - (PrT_{n-1} - PrTT_{n-1})\}/RR$$

where: '$PoT_{n-1}$' and '$PoTT_{n-1}$' represent a remaining thickness of the product after a previous CMP process and a target thickness thereof after the previous CMP process, respectively; '$PrT_n$' and '$PrTT_n$' represent a thickness of the product to be subjected to a current CMP process and a target thickness thereof, respectively; '$PrT_{n-1}$' and '$PrTT_{n-1}$' represent a thickness of the product and a target thickness thereof before the current CMP process, respectively, wherein the product is a product after the current CMP process; and 'RR' represents an average removal rate of the product by the CMP process.

17. A control system for a semiconductor device manufacturing process comprising:

a sample logic unit to calculate a sample process time of a product applied to the semiconductor device manufacturing process for the first time; and a main process control unit to calculate a main process time by applying the sample process time to a main process time calculation equation and to control the semiconductor device manufacturing process;

wherein the sample logic unit is configured to calculate the sample process time by multiplying a predetermined ratio of a conversion factor for process times of semiconductor products corresponding to a consumption time of a consumable article used in the semiconductor device manufacturing process with a conversion factor for the applied product.

18. The control system of claim 17, including an information storage table unit to receive the sample process time from the sample logic unit and store the received sample process time.

19. The control system of claim 17, wherein the semiconductor manufacturing process includes at least one of a chemical mechanical polishing (CMP) process, a deposition process, an etching process, and a cleaning process.

20. A control system for a semiconductor device manufacturing process comprising:

a sample logic unit to calculate a sample process time of a product applied to the semiconductor device manufacturing process for the first time; and a main process control unit to calculate a main process time by applying the sample process time to a main process time calculation equation and to control the semiconductor device manufacturing process;

wherein the main process control unit is configured to calculate the main process time using the main process time calculation equation defined as follows:

$$T_n = \{T_{n-1} + E_n\} \times CF_n / CF_{n-1}$$

where '$T_n$', '$T_{n-1}$', '$E_n$', '$CF_n$', and '$CF_{n-1}$' represent a process time of a current operation stage, a process time of a previous operation stage, an error factor with respect to a thickness of the product, a conversion factor of the current operation stage of the semiconductor device manufacturing process, and a conversion factor of the previous operation stage thereof, respectively.

21. The control system of claim 20, wherein, if the main process is performed for the first time (n=1), the sample process time is substituted for '$T_{n-1}$', the conversion factor '$CF_n$' is substituted for '$CF_{n-1}$', and '$T_n$' is taken as an initial main process time for the product.

22. The control system of claim 20, wherein the conversion factor '$CF_n$' is calculated by multiplying a first conversion factor corresponding to an increasing or decreasing thickness of the product during the semiconductor device manufacturing process with a second conversion factor corresponding to a pattern density of the product.

23. The control system of claim 22, wherein the first conversion factor is determined using a graph or an equation for known conversion factors corresponding to the increasing or decreasing thickness of the product, and the second conversion factor is determined using a graph or an equation for known conversion factors corresponding to the pattern density of the product.

24. The control system of claim 20, wherein the main process time is calculated using the error factor defined as follows:

$$E_n = \{(PoT_{n-1} - PoTT_{n-1}) + (PrT_n - PrTT_n) - (PrT_{n-1} - PrTT_{n-1})\}/RR$$

where: '$PoT_{n-1}$' and '$PoTT_{n-1}$' represent a remaining thickness of the product after a previous process and a target thickness thereof after the previous process, respectively; '$PrT_n$' and '$PrTT_n$' represent a thickness of the product to be subjected to a current process and a target thickness thereof respectively; 'PrTn−1' and 'PrTTn−1' represent a thickness of the product and a target thickness thereof before the current CMP process, respectively, wherein the product is a product after the current CMP process; and 'RR' represents an average removal rate of the product by the process.

* * * * *

UNITED STATES PATENT AND TRADEMARK OFFICE
CERTIFICATE OF CORRECTION

PATENT NO. : 7,376,481 B2  Page 1 of 1
APPLICATION NO. : 11/430571
DATED : May 20, 2008
INVENTOR(S) : Hwang et al.

It is certified that error appears in the above-identified patent and that said Letters Patent is hereby corrected as shown below:

In the claims:

Column 10, Claim 12, Line 29: Please add -- '$CF_n$', -- before the word "and".

Signed and Sealed this

Nineteenth Day of August, 2008

JON W. DUDAS
*Director of the United States Patent and Trademark Office*